(12) United States Patent
Hansen

(10) Patent No.: US 12,121,884 B2
(45) Date of Patent: Oct. 22, 2024

(54) PRESSURE VESSEL AND CLOSURE SYSTEM FOR IMPROVED PRESSURE PROCESSING

(71) Applicant: Brian Hansen, Loveland, CO (US)

(72) Inventor: Brian Hansen, Loveland, CO (US)

( * ) Notice: Subject to any disclaimer, the term of this patent is extended or adjusted under 35 U.S.C. 154(b) by 1127 days.

(21) Appl. No.: 16/392,857

(22) Filed: Apr. 24, 2019

(65) Prior Publication Data

US 2019/0331300 A1 Oct. 31, 2019

Related U.S. Application Data

(60) Provisional application No. 62/662,260, filed on Apr. 25, 2018.

(51) Int. Cl.
| | | |
|---|---|---|
| *B01J 3/03* | (2006.01) | |
| *B01J 3/00* | (2006.01) | |
| *B01J 3/04* | (2006.01) | |
| *H01L 21/67* | (2006.01) | |
| *F16J 13/00* | (2006.01) | |

(52) U.S. Cl.
CPC ............... *B01J 3/04* (2013.01); *B01J 3/002* (2013.01); *B01J 3/008* (2013.01); *B01J 3/03* (2013.01); *H01L 21/67028* (2013.01); *H01L 21/67034* (2013.01); *F16J 13/00* (2013.01)

(58) Field of Classification Search
None
See application file for complete search history.

(56) References Cited

U.S. PATENT DOCUMENTS

| | | | | |
|---|---|---|---|---|
| 2,538,089 | A * | 1/1951 | Louis | F16J 13/04 |
| | | | | 292/259 R |
| 2,867,237 | A * | 1/1959 | Allingham | F25B 41/26 |
| | | | | 137/625.29 |
| 4,192,849 | A * | 3/1980 | Scheubeck | G01N 31/12 |
| | | | | 422/74 |
| 4,297,323 | A * | 10/1981 | Tetzlaff | F16J 13/00 |
| | | | | 422/208 |
| 4,965,601 | A * | 10/1990 | Canty | G02B 23/24 |
| | | | | 396/419 |
| 7,028,698 | B2 * | 4/2006 | Hansen | H01L 21/67751 |
| | | | | 134/107 |
| 9,627,233 | B2 * | 4/2017 | Kim | H01L 21/6708 |
| 2003/0177659 | A1 * | 9/2003 | Saito | H01L 21/67034 |
| | | | | 34/107 |
| 2003/0218014 | A1 * | 11/2003 | Gregory | B01J 3/03 |
| | | | | 422/296 |
| 2019/0096712 | A1 * | 3/2019 | Park | H01L 21/302 |

FOREIGN PATENT DOCUMENTS

WO  WO-2013058052 A1 *  4/2013  ....... H01L 21/67092

* cited by examiner

*Primary Examiner* — Jennifer A Leung
(74) *Attorney, Agent, or Firm* — Emanus, LLC; Willie Jacques

(57) ABSTRACT

An apparatus is disclosed for improved high pressure processing of parts and materials with fast cycle time, clean operation, and easy to change pressure vessels. Applications include but are not limited to pressure vessels for critical point drying of MEMS or SEM samples, parts cleaning, supercritical fluid extraction, and aerogel processing. In a specific embodiment, the pressure vessel can operate near or above the critical pressure and temperature of a fluid in the pressure vessel for parts processing. This includes critical point drying of MEMS or SEM samples in an easy to use processing pressure chamber system.

21 Claims, 3 Drawing Sheets

PRESSURE VESSEL AND CLOSURE SYSTEM FOR IMPROVED PRESSURE PROCESSING

FIELD OF THE INVENTION

The present invention relates to methods and apparatus for high pressure fluid processing. In more specific embodiments, the present invention relates to a pressure vessel, closure, and sealing system that can operate at high pressures to contain fluids near or above the critical point for processing materials in processes such as critical point drying, cleaning, extraction, or other processes requiring high pressure fluids. More particularly, critical point drying (CPD) refers, for example, to drying of MEMs devices after wet etching avoiding surface tension damage (stiction) or dehydration of samples for examination in an electron microscope without surface tension damage. In a common drying process, wet samples are mostly dehydrated by replacing water with (most often) a lower surface tension liquid solvent such as alcohols or acetone that can solubilize water. Drying even from a lower surface tension liquid solvent can still damage fine structures so these solvent wet samples can be placed in a critical point dryer pressure chamber to eliminate solvent. In the pressure vessel carbon dioxide ($CO_2$) is most often used to form a solution with the intermediate fluid (acetone, alcohols, etc.) to replace with mostly $CO_2$ (transition fluid) that can be decompressed around the critical point or a very low surface tension path to atmospheric pressure. This process of "critical point drying" (CPD) is the most likely anticipated use of the equipment often referred to as a critical point dryer (CPD).

BACKGROUND OF THE INVENTION

Pressure vessels that are easy to open and close fast in a clean environment are important in many fields including, but not limited to, critical point drying, high pressure small parts cleaning, and supercritical fluid extraction. Although there are numerous patents for critical point dryers (CPDs) this invention significantly improves the fast operation, safety, pressure vessel closure, and minimization of contaminates in the work pieces being processed in the pressure vessel. U.S. Pat. No. 7,028,698 B2 issued to Hansen et. al., (present invention inventor) discloses a pressure chamber, that raises up a plunger in a system that limits easy changes to different sizes and/or volumes of chambers. The present invention overcomes this problem with a chamber lid that is pulled down to a surface that the pressure vessel can slide on into the closure system. With a large vertical displacement top it is possible to change chamber height. The present invention also provides improvement advantages over alternative closure actuators and additional safety features. U.S. Pat. Nos. 6,048,494 and 6,067,728 and 5,979,306 all disclose chamber closure systems that are susceptible to contamination and are not easy to change chamber size.

The most common manual closure systems use high tensile strength hex cap screw bolts that shed particles that can contaminate clean room environments where MEMs are often made and contaminate MEMs samples. The opening and closing of these systems consumes a lot of time and may require significant strength. Furthermore, these manual bolt closure systems require even bolt tightening for safety, and require counter space for lid, bolts and tools in an expensive workspace environment.

A preferred embodiment of the present invention provides a mechanism under the pressure vessel platform that allows horizontal movement of the pressure vessel under the lid and then an actuator to move the pressure vessel lid vertically with low surface area rods with an actuator mechanism sealed from clean room environment. In another embodiment the bottom support and lid have a fixed distance for a given pressure vessel height and the seal is designed to seal without the vertical movement of the lid.

SUMMARY OF THE INVENTION

The present invention is provided to overcome one or more disadvantages of the prior art. In one embodiment, the invention comprises (a) a high pressure vessel designed to contain a fluid above atmospheric pressure conditions, (b) a sealing element positionable against the high pressure vessel cover to form a seal between the high pressure region and the surrounding low pressure region, (c) an actuator operable to move the pressure vessel lid against or away from sealing element to open and close pressure vessel. In a specific embodiment, for the purpose of critical point drying the pressure vessel contains a low surface tension transition fluid near or above its critical temperature and pressure conditions where the fluid for example, is carbon dioxide or trifluoromethane (R-23) that is used to dissolve and/or sweep away a non aqueous intermediate fluid such as acetone or alcohols that was used to dissolve and/or sweep away most of the water used in wet samples. In this specific embodiment the transition fluid is operated near or above the critical pressure and temperature to reduce or eliminate surface tension in the dense fluid elimination process. In another embodiment, the actuator is eliminated, where the invention comprises (a) a high pressure vessel designed to contain a fluid above atmospheric pressure conditions, (b) a sealing element positionable against the high pressure vessel cover to form a seal, (c) the seal is designed to seal without an actuator movement requiring only horizontal movement of the pressure vessel into a rectangle tunnel shaped lid and bottoms support.

BRIEF DESCRIPTION OF THE DRAWINGS

Specific embodiments and features of the invention are described in the figures with indicated reference numerals, these features and embodiments are illustrative and not intended to limit the invention described herein, wherein.

DETAILED DESCRIPTION

The present invention provides various advantages in certain embodiments. For example, it is an advantage in certain embodiments of the invention to provide different actuator options for the pressure vessel closure in the pressure chamber system for different applications where, for example, high pressure fluid price may limit usage or cleanroom operations may restrict certain designs.

DRAWINGS

Figure 1:
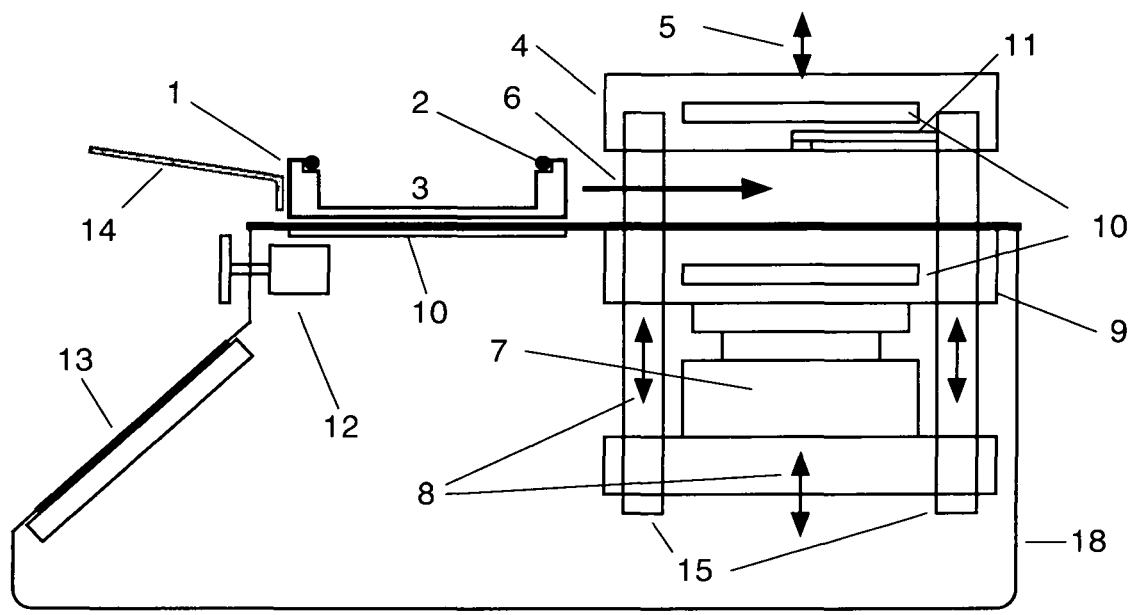
FIG. 1 is a schematic diagram depicting a side view cross section of the pressure chamber system of the invention in a first embodiment.

Reference Numerals 1. pressure vessel
2. pressure vessel seal
3. pressurized fluid region
4. pressure vessel lid or cover
5. movement of pressure vessel lid or cover
6. movement of pressure vessel under pressure vessel lid
7. actuator for moving lid movement of actuator coupled parts to move pressure vessel lid
9. spacer, heating, locking pin actuator sensor etc. space
10. heating cooling devices
11. fluid flow possibility
12. valves and controls
13. display and possible control computer
14. handle to slide pressure vessel into closure space
15. rods that connect actuator force to the pressure vessel lid
16. conduit to lid electrical wires and other connections
17. pins that help align and secure pressure vessel
18. enclosure for pressure chamber system
19. recess in pressure vessel cover for alignment of, holding of and safety of pressure vessel during depressurization
20. bolts threaded into pressure vessel lid assembly that pull down lid
21. thread cover tubes cover tubes or unthreaded region for cleanroom environment
22. threaded nuts with gears to move top plate as they rotate
23. series reduction spur gears that synchronize all the threaded shafts that pull down and hold the pressure vessel lid assembly.
24. Motor drive and encoder connected to final spur gear that is synchronized to all other gears.
25. Gear box protecting pressure chamber system enclosure from lubricants
26. gas cylinder or diaphragm actuator or hydraulic actuator
27. gas or fluid pressure inlet to close pressure vessel
28. gas or fluid pressure inlet to open pressure vessel lid
29. springs are an alternative opening force to gas or fluid pressure inlet to open pressure vessel lid
30. configuration for 2 or more hydraulic or air cylinders connected in parallel to pull lid down on pressure vessel lid assembly
31. pressure vessel lid assembly closing pressure inlet
32. pressure vessel lid assembly opening pressure inlet In the first embodiment as depicted in FIG. 1 the invented pressure chamber system shows a pressure chamber system that can close without bolts and can accommodate different pressure vessel sizes. This design significantly reduces particulate matter that can be generated from bolts, lateral movement of lid, lid stored upside down, and lifting over open pressure vessel.

FIG. 1 is a diagram depicting a side view of the pressure chamber system of the invention in a first embodiment. This shows the advantages that the pressure vessel can be temperature controlled on the top, slid into chamber system with pins that can lock the vessel into position and close the lid for safe operation. In this first embodiment showing the lid pulled down to the pressure vessel on a flat surface has the advantage of using a very thin bottom pressure vessel safer than raising the pressure vessel to the lid.

Figure 2:
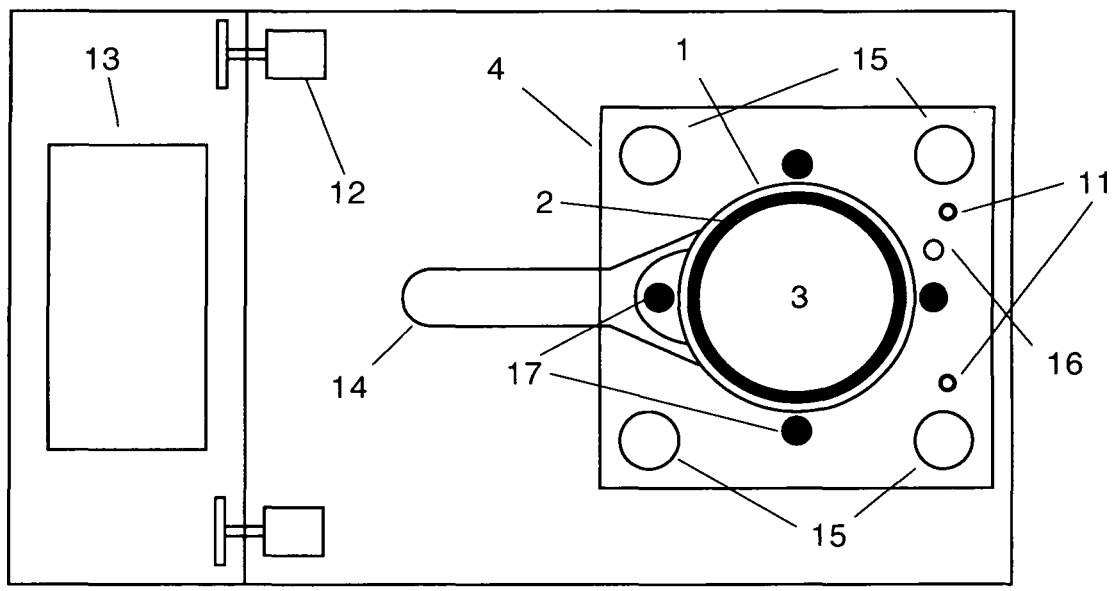
FIG. 2 is a schematic diagram depicting a cross section of the pressure chamber system of the invention in another embodiment.

FIG. 2 is a diagram depicting a top view of the pressure chamber system invention showing the advantages of pins to position pressure vessel. In this embodiment the pins on the back and sides can stay raised to guide pressure vessel into position. The front pin can be raised locking the pressure vessel into position before the pressure vessel lid is lowered for closing.

Figure 3:
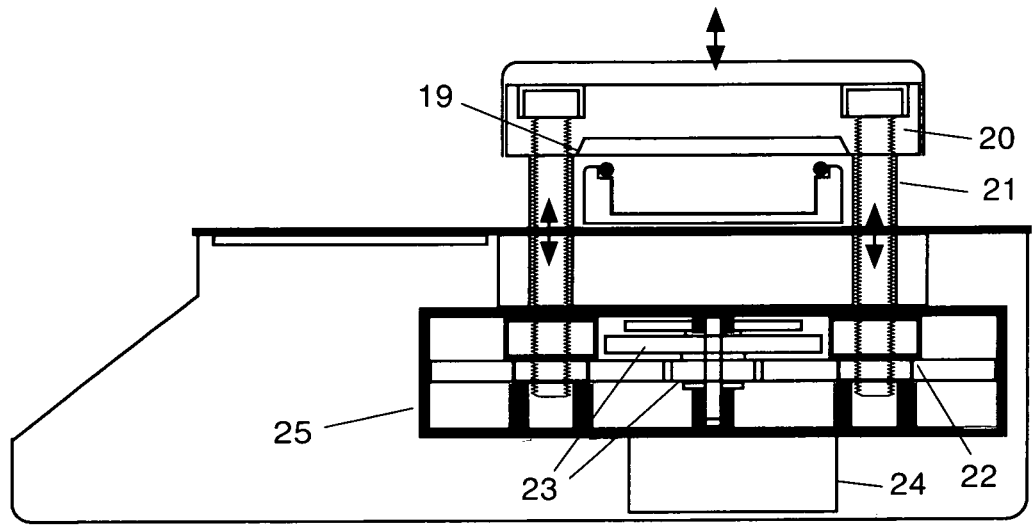
FIG. 3 is a schematic diagram depicting a cross section of the pressure chamber system showing a side view of the gear synchronized threaded shafts or bolts threaded from underneath in another embodiment of the invention.

FIG. 3 is a diagram depicting a cross section of the pressure chamber system showing a side view of the gear synchronized threaded shafts or bolts threaded from underneath in another embodiment of the invention. This has the advantage that the pressure vessel lid assembly is always very parallel to the base and pressure vessel top. Furthermore, under pressure the force with the correct thread pitch can prevent the lid from opening because this could be beyond the torque of the motor. This has the further advantage that the bolts can be totally covered with no rotation above the base of the pressure vessel with only small vertical movement above the actuator enclosure.

Figure 4:
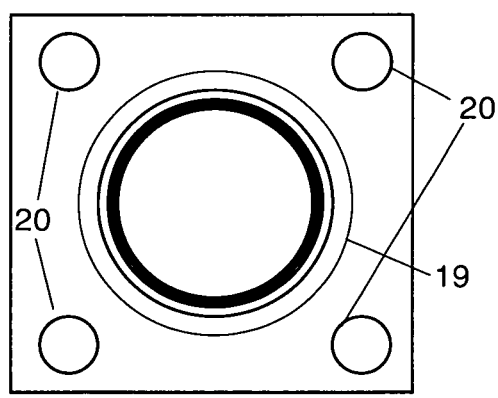
FIG. 4 is a schematic diagram of a through the top view of the pressure vessel lid assembly in another embodiment of the invention.

FIG. 4 is a diagram looking through the top of the pressure vessel lid assembly in another embodiment of the invention. This shows the advantage of the recess 19 that prevents lateral movement of the pressure vessel when it is closed. Furthermore, this configuration with the tapered entry angel helps align the pressure while closing and safe pressure relief while opening. In this embodiment mechanical geometries for the pressure vessel lid coming down to close the chamber will be the safest.

Figure 5:
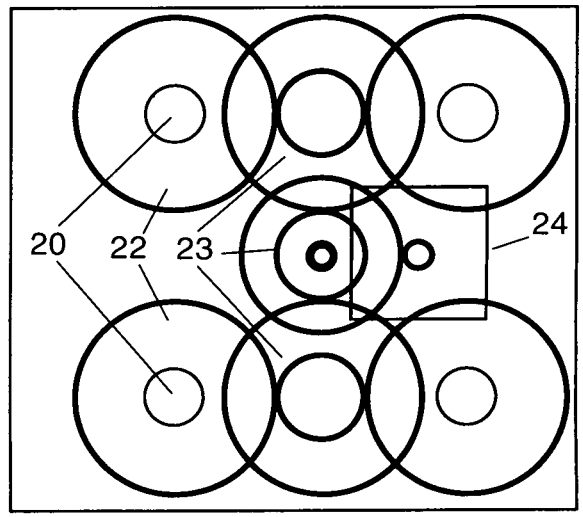
FIG. 5 is a schematic diagram showing gears synchronizing shafts for parallel lowering of the pressure vessel lid in another embodiment of the invention.

FIG. 5 is a diagram showing gears synchronizing shafts for parallel lowering of the pressure vessel lid in another embodiment of the invention. The gears in this embodiment have the advantage of gear reduction for low torque motor and very parallel operation.

Figure 6:
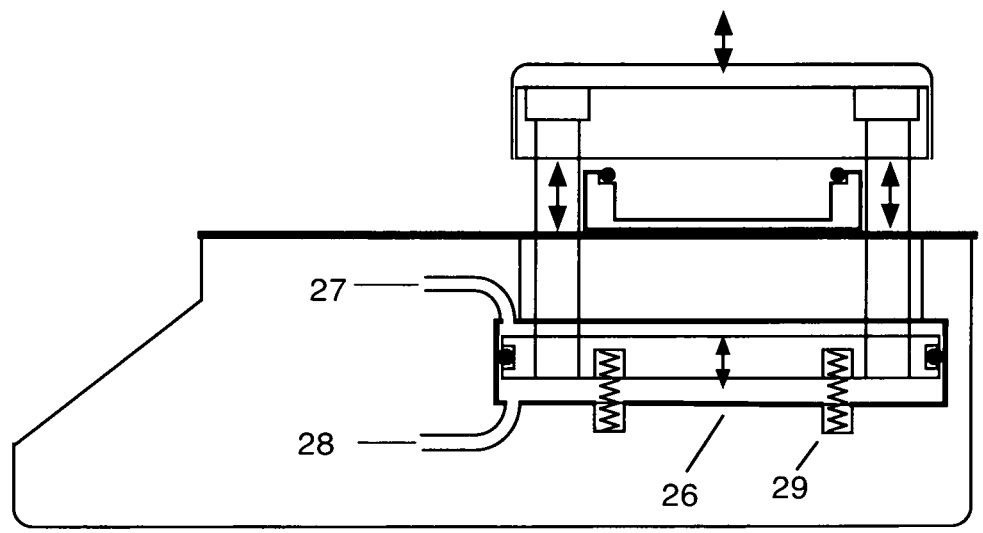
FIG. 6 is a schematic diagram depicting a gas or fluid powered actuator cross section of the pressure chamber system of the invention in another embodiment.

FIG. 6 is a diagram depicting a gas or fluid powered actuator cross section of the pressure chamber system of the invention in another embodiment. This approach will create a very light weight system especially if the gas cylinder or gas diaphragm actuator is operated with the chamber fluid gas where the actuator area is greater than the pressure vessel opening area for safe closing with excess force. When using process gas a valve will be used to prevent back flow from actuator to pressure vessel and heating may be used to prevent liquid (possible $CO_2$) in actuator.

Figure 7:
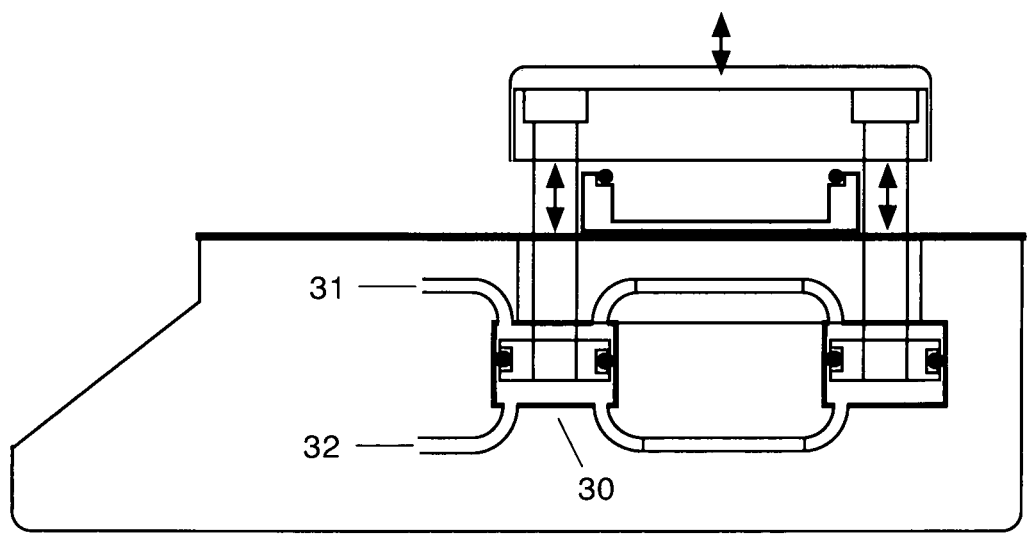
FIG. 7 is a schematic diagram depicting a hydraulic powered actuator cross section of the pressure chamber system of the invention in another embodiment.

FIG. 7 is a diagram depicting a hydraulic powered actuator cross section of the pressure chamber system of the invention in another embodiment. In this embodiment individual hydraulic or gas cylinders (including but to limited to $CO_2$) on each rod pressurized in parallel in a two or more rod configuration can be advantageous for space inside enclosure below pressure vessel.

The specification describes many embodiments of the invention with certain embodiments described in more detail. In a specific embodiment, for the purpose of critical point drying the pressure vessel contains a low surface tension transition fluid near or above its critical temperature and pressure conditions where the fluid for, example is carbon dioxide, is used to dissolve and/or sweep away a non aqueous intermediate fluid such as acetone or alcohols that was used to dissolve and/or sweep away most of the water used in wet samples. In this specific embodiment the transition fluid is operated near or above the critical pressure and temperature to reduce or eliminate surface tension in the dense fluid elimination process. This transition fluid can be pumped in and out of the pressure chamber system wherein a thermal pumping system with reversing heat pump valve is used to compress transition fluid and/or separate transition fluid from intermediate fluid in the process.

In another embodiment, the pressure chamber system has a magnetic stir system and/or flow pattern in the pressure vessel, parts holder, or vessel lid that can facilitate fluid mixing or improved flow to improve fluid processing in the pressure chamber system.

In another embodiment, the pressure chamber system has alignment pins wherein alignment pins and a pressure vessel feature eliminates rotational freedom so that an off center fluid channel in the pressure vessel or holder can align with fluid port or ports off center in the stationary part of the closure system.

In another embodiment, the pressure chamber system has a pressure vessel that has a fixed or removable handle.

In another embodiment, the pressure chamber system has guides, pins, or a recess that position and/or hold the position of the pressure vessel for safe pressurization of the pressure process chamber system. In a more specific embodiment, the recess in part of the vertical moving pressure vessel lid that traps the pressure vessel until it is almost entirely in the open position for the pressure vessel. Another more specific embodiment includes a pressure chamber system, wherein the recess in the lid has a self aligning angle as it closes with gas release spaces to release pressure before total opening preventing unsafe lateral movement of pressure vessel and directing gas flow in safe direction during pressure vessel opening.

In another embodiment, the pressure chamber system has a pressure vessel with a removable thin insert in contact with the fluid. The removable insert can be a liner in the pressure vessel. In a more specific embodiment the removable liner may also incorporate the pressure vessel seal wherein a flange on the liner is used to seal against the top plate. The flange could also seal against the seal in another embodiment. The pressure vessel in another embodiment defining a pressure vessel with a thin bottom has most of the structure opposing the fluid pressure being part of the stationary pressure chamber closure. In another embodiment a removable pressure vessel liner which may include a thin lid. In other embodiments, the removable thin insert in contact with fluid that may have a flange to seal against top plate or seal.

In another embodiment, the pressure chamber system has window(s) for lighting and viewing inside high pressure vessel which can include video camera and monitor for viewing. In other embodiments the pressure chamber system includes a removable pressure vessel liner which may include a thin lid made of metal or polymer such as fluorinated polymers like polytetrafluoroethylene.

In another embodiment, the pressure chamber system has an actuator wherein the actuator is actuated by gas cylinder or gas diaphragm, or an actuator that uses mechanically synchronized screws {for example gears, chains, or belts), or an actuator that uses cams, wedges, or inclined planes, or an actuator with hydraulic cylinder(s), or ah actuator that uses a single screw drive in the pressure chamber system.

The various embodiments described herein are illustrative in nature only and are non-limiting of the invention defined by the claims.

What is claimed is:

1. A pressure chamber system, comprising:
   a pressure vessel having a bottom wall and a side wall, the pressure vessel defining a pressurized fluid region for containing a fluid at pressures higher than atmospheric pressure;
   a pressure vessel sealing element at an upper end of the side wall;
   a pressure vessel lid positionable against the pressure vessel sealing element to close a top of the pressure vessel;
   a pressure vessel support surface for supporting the bottom wall of the pressure vessel;
   an actuator operable to move the pressure vessel lid toward the pressure vessel sealing element to close the top of the pressure vessel and away from the pressure vessel sealing element to open the top of the pressure vessel; and
   a plurality of pins located on the pressure vessel support surface to align and secure the pressure vessel in a required position below the pressure vessel lid;
   wherein the plurality pins are each movable between a lowered position and a raised position relative to the pressure vessel support surface;
   wherein, when the pressure vessel is in the required position below the pressure vessel lid and a user is facing the pressure vessel, a back pin of the plurality of pins is located behind the pressure vessel, a first side pin of the plurality of pins is located at a first side of the pressure vessel, a second side pin of the plurality of pins is located at a second side of the pressure vessel opposite ta the first side of the pressure vessel, and a front pin of the plurality of pins is located in front of the pressure vessel; and
   during a pressure vessel aligning operation, the back pin, the first side pin, and the second side pin are each set to their raised positions and the front pin is set to its lowered position, so that the pressure vessel is aligned by the back pin, the first side pin, and the second side pin and guided to the required position below the pressure vessel lid; and,
   during a pressure vessel securing operation which follows the pressure vessel aligning operation, the front pin is set to its raised position, so that the pressure vessel is secured by the back pin, the first side pin, the second side pin, and the front pin in the required position below the pressure vessel lid.

2. The pressure chamber system according to claim 1, wherein the actuator is selected from an air cylinder system, a hydraulic cylinder system, or a synchronized screw mechanism.

3. The pressure chamber system according to claim 1, further comprising an enclosure defining the pressure vessel support surface, wherein the actuator is contained within the enclosure.

4. The pressure chamber system according to claim 1, further comprising a thermal pumping system with a reversing heat pump valve for supplying fluid to or removing fluid from the pressurized fluid region.

5. The pressure chamber system according to claim 1, further comprising a magnetic stir system for mixing the fluid in the pressurized fluid region.

6. The pressure chamber system according to claim 1, wherein the pressure vessel comprises a structure that engages with the plurality of pins to prevent a rotational movement of the pressure vessel when the pressure vessel is secured in the required position below the pressure vessel lid.

7. A pressure chamber system, comprising:
- a pressure vessel having a bottom wall and a side wall, the pressure vessel defining a pressurized fluid region for containing a fluid at pressures higher than atmospheric pressure;
- a pressure vessel sealing element at an upper end of the side wall;
- a pressure vessel lid positionable against the pressure vessel sealing element to close a top of the pressure vessel;
- a pressure vessel support surface for supporting the bottom wall of the pressure vessel;
- an actuator operable to move the pressure vessel lid toward the pressure vessel sealing element to close the top of the pressure vessel and away from the pressure vessel sealing element to open the top of the pressure vessel; and
- a recess located on the pressure vessel lid to align and secure the pressure vessel in a required position below the pressure vessel lid; wherein the pressure vessel lid is movable between a raised position and a lowered position relative to the pressure vessel support surface; and
- wherein the pressure vessel lid recess is configured to trap the pressure vessel in the required position when the actuator begins to move the pressure vessel lid away from the pressure vessel sealing element.

8. The pressure chamber system according to claim 7, wherein the recess is further configured to release a gas from the pressure vessel and direct the gas away from the pressure vessel when the actuator begins to move the pressure vessel lid away from the pressure vessel sealing element.

9. The pressure chamber system according to claim 7, wherein the pressure vessel comprises a fixed or a removable handle.

10. The pressure chamber system according to claim 7, wherein the pressure vessel support surface and the pressure vessel lid each comprise heating and cooling devices for controlling the temperature of the pressure vessel.

11. The pressure chamber system according to claim 7, further comprising a removable insert located in the pressure vessel that contacts the fluid in the pressurized fluid region.

12. The pressure chamber system according to claim 11, wherein the removable insert comprises a removable liner having a flange to seal against the pressure vessel lid or the pressure vessel sealing element.

13. The pressure chamber system according to claim 11, wherein the pressure vessel has a removable pressure vessel liner that includes a thin lid made of metal or polymer.

14. The pressure chamber system according to claim 11, wherein the pressure vessel is light weight with a thin bottom with most of a structure opposing fluid pressure being part of a stationary chamber closure.

15. The pressure chamber system according to claim 7, wherein the distance between the pressure vessel support surface and the pressure vessel lid allows for different pressure vessel heights to be accommodated between the pressure vessel support surface and the pressure vessel lid.

16. The pressure chamber system according to claim 7, further comprising at least one window for lighting and viewing the inside of the pressure vessel, and a video camera and monitor for the viewing.

17. The pressure chamber system according to claim 7, wherein the actuator comprises a gas cylinder or a gas diaphragm driven by a compressed gas source.

18. The pressure chamber system according to claim 7, wherein the actuator comprises a system of mechanically synchronized screws.

19. The pressure chamber system according to claim 7, wherein the actuator comprises at least one hydraulic cylinder.

20. The pressure chamber system according to claim 7, wherein the actuator comprises a single screw drive.

21. The pressure chamber system according to claim 7, wherein the actuator comprises four rods connected to the pressure vessel lid, the rods being integrated with one or more air cylinders, one or more hydraulic cylinders, or a synchronized screw mechanism.

* * * * *